(12) United States Patent
Merry et al.

(10) Patent No.: US 10,847,391 B2
(45) Date of Patent: Nov. 24, 2020

(54) SEMICONDUCTOR DEVICE MANUFACTURING PLATFORM WITH SINGLE AND TWINNED PROCESSING CHAMBERS

(71) Applicant: Applied Materials, Inc., Santa Clara, CA (US)

(72) Inventors: Nir Merry, Mountain View, CA (US); Michael Robert Rice, Pleasanton, CA (US); Sushant S. Koshti, Sunnyvale, CA (US); Jeffrey C. Hudgens, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1150 days.

(21) Appl. No.: 14/180,954

(22) Filed: Feb. 14, 2014

(65) Prior Publication Data

US 2014/0262035 A1 Sep. 18, 2014

Related U.S. Application Data

(60) Provisional application No. 61/778,206, filed on Mar. 12, 2013.

(51) Int. Cl.
*H01L 21/677* (2006.01)
*H01L 21/67* (2006.01)

(52) U.S. Cl.
CPC .... *H01L 21/6719* (2013.01); *H01L 21/67196* (2013.01)

(58) Field of Classification Search
CPC ......... H01L 21/67703; H01L 21/67167; H01L 21/67196
See application file for complete search history.

(56) References Cited

U.S. PATENT DOCUMENTS 5,928,389 A * 7/1999 Jevtic ............... G05B 19/41865
29/25.01
5,951,770 A 9/1999 Perlov et al.
(Continued)

FOREIGN PATENT DOCUMENTS

KR 10-2010-0010867 2/2010

OTHER PUBLICATIONS

International Search Report & Written Opinion of International Application No. PCT/US2014/016476 dated Jul. 22, 2014.
(Continued)

*Primary Examiner* — Parviz Hassanzadeh
*Assistant Examiner* — Nathan K Ford
(74) *Attorney, Agent, or Firm* — Lowenstein Sandler LLP

(57) ABSTRACT

A transfer chamber for semiconductor device manufacturing includes (1) a plurality of sides that define a region configured to maintain a vacuum level and allow transport of substrates between processing chambers, the plurality of sides defining a first portion and a second portion of the transfer chamber and including (a) a first side that couples to two twinned processing chambers; and (b) a second side that couples to a single processing chamber; (2) a first substrate handler located in the first portion of the transfer chamber; (3) a second substrate handler located in the second portion of the transfer chamber; and (4) a hand-off location configured to allow substrates to be passed between the first portion and the second portion of the transfer chamber using the first and second substrate handlers. Method aspects are also provided.

7 Claims, 4 Drawing Sheets

(56) References Cited

U.S. PATENT DOCUMENTS

| | | | |
|---|---|---|---|
| 6,071,055 | A | 6/2000 | Tepman |
| 6,287,386 | B1 | 9/2001 | Perlov et al. |
| 6,440,261 | B1* | 8/2002 | Tepman ............ H01L 21/67161 |
| | | | 118/715 |
| 6,468,353 | B1 | 10/2002 | Perlov et al. |
| 6,575,737 | B1 | 6/2003 | Perlov et al. |
| 6,916,397 | B2 | 7/2005 | Pfeiffer et al. |
| 7,720,655 | B2 | 5/2010 | Rice |
| 2002/0170672 | A1 | 11/2002 | Perlov et al. |
| 2002/0192056 | A1* | 12/2002 | Reimer ................ H01L 21/681 |
| | | | 414/217 |
| 2003/0213560 | A1 | 11/2003 | Wang et al. |
| 2005/0072716 | A1 | 4/2005 | Quiles et al. |
| 2009/0014127 | A1 | 1/2009 | Shah et al. |
| 2009/0108544 | A1 | 4/2009 | Sico et al. |
| 2012/0305196 | A1 | 12/2012 | Mori et al. |

OTHER PUBLICATIONS

International Preliminary Report on Patentability of International Application No. PCT/US2014/016476 dated Sep. 24, 2015.
Hongkham et al., U.S. Appl. No. 14/202,763, titled: "Processing Systems, Apparatus, and Methods Adapted to Process Substrates in Electronic Device Manufacturing," filed Mar. 10, 2014.
Reuter et al., U.S. Appl. No. 14/203,098, titled: "Process Load Lock Apparatus, Lift Assemblies, Electronic Device Processing Systems, and Methods of Processing Substrates in Load Lock Locations," filed Mar. 10, 2014.
Taiwan Search Report of Taiwan Application No. 103108694 dated Jun. 13, 2017.

* cited by examiner

SEMICONDUCTOR DEVICE MANUFACTURING PLATFORM WITH SINGLE AND TWINNED PROCESSING CHAMBERS

RELATED APPLICATIONS

The present application claims priority to U.S. Provisional Application 61/778,206 filed Mar. 12, 2013, and entitled "SEMICONDUCTOR DEVICE MANUFACTURING PLATFORM WITH SINGLE AND TWINNED PROCESSING CHAMBERS", which is hereby incorporated herein for all purposes.

FIELD

The present invention relates to semiconductor device manufacturing, and more specifically to a semiconductor device manufacturing platform with single and twinned processing chambers.

BACKGROUND

Manufacturing of semiconductor devices typically involves performing a sequence of procedures with respect to a substrate or "wafer" such as a silicon substrate, a glass plate, etc. These steps may include polishing, deposition, etching, photolithography, heat treatment, and so forth. Usually a number of different processing steps may be performed in a single processing system or "tool" which includes a plurality of processing chambers or "reactors".

To reduce semiconductor device manufacturing costs, methods and apparatus for improving efficiency and/or reducing cost of operation of processing tools are desired.

SUMMARY

In some embodiments, a transfer chamber configured for use during semiconductor device manufacturing is provided. The transfer chamber includes (1) a plurality of sides that define a region configured to maintain a vacuum level and allow transport of substrates between a plurality of processing chambers, the plurality of sides defining a first portion of the transfer chamber and a second portion of the transfer chamber and including (a) a first side that couples to two twinned processing chambers; and (b) a second side that couples to a single processing chamber. The transfer chamber also includes (2) a first substrate handler located in the first portion of the transfer chamber; (3) a second substrate handler located in the second portion of the transfer chamber; and (4) a hand-off location configured to allow substrates to be passed between the first portion of the transfer chamber and the second portion of the transfer chamber using the first substrate handler and the second substrate handler.

In some embodiments, a method is provided that includes (a) providing a transfer chamber having a plurality of sides that define a region configured to maintain a vacuum level and allow transport of substrates between a plurality of processing chambers, the plurality of sides defining a first portion of the transfer chamber and a second portion of the transfer chamber and including a first side coupled to two twinned processing chambers and a second side coupled to a single processing chamber; a first substrate handler located in the first portion of the transfer chamber; a second substrate handler located in the second portion of the transfer chamber; and a hand-off location configured to allow substrates to be passed between the first portion of the transfer chamber and the second portion of the transfer chamber using the first substrate handler and the second substrate handler; (b) loading a first substrate into the transfer chamber employing the first substrate handler; (c) transferring the first substrate to the hand-off location; (d) retrieving the first substrate from the hand-off location with the second substrate handler; (e) loading a second substrate into the transfer chamber employing the first substrate handler; and (f) simultaneously loading the first and second substrates into the twinned processing chambers coupled to the first side of the transfer chamber using the first and second substrate handlers.

In some embodiments, a transfer chamber configured for use during semiconductor device manufacturing is provided. The transfer chamber includes (1) a plurality of sides that define a region configured to maintain a vacuum level and allow transport of substrates between a plurality of processing chambers, the plurality of sides including (a) a first, elongated side that couples to two twinned processing chambers; (b) a second side that couples to a single processing chamber; and (c) a third side that couples to a load lock chamber. The transfer chamber also includes (2) an extended-reach substrate handler located in the transfer chamber and configured to transport substrates between the load lock chamber, twinned processing chambers and single processing chamber; and (3) a hand-off location configured to provide on or more of a transfer location, substrate storage, chuck cover storage, cool-down, substrate heating, pre-processing and post-processing. Numerous other embodiments are provided.

DETAILED DESCRIPTION

In accordance with embodiments of the present invention, a semiconductor device manufacturing platform, such as a tool and/or mainframe, is provided that may allow both single processing chambers and dual or "twinned" processing chambers to be employed. Twinned processing chambers may provide reduce operation costs by sharing resources such as chemical and/or gas delivery, process control, and the like. In some embodiments, the manufacturing platform may support up to six processing chambers with either two or four of the processing chambers being twinned. Other configurations may be employed.

In one or more embodiments, hand-off locations are provided within the tool that allows substrates to be passed from one portion of the tool to another portion of the tool. In some embodiments, these hand-off locations may provide active pre- and/or post-processing. These and other embodiments of the invention are described below with reference to FIGS. 1-4.

Figure 1:
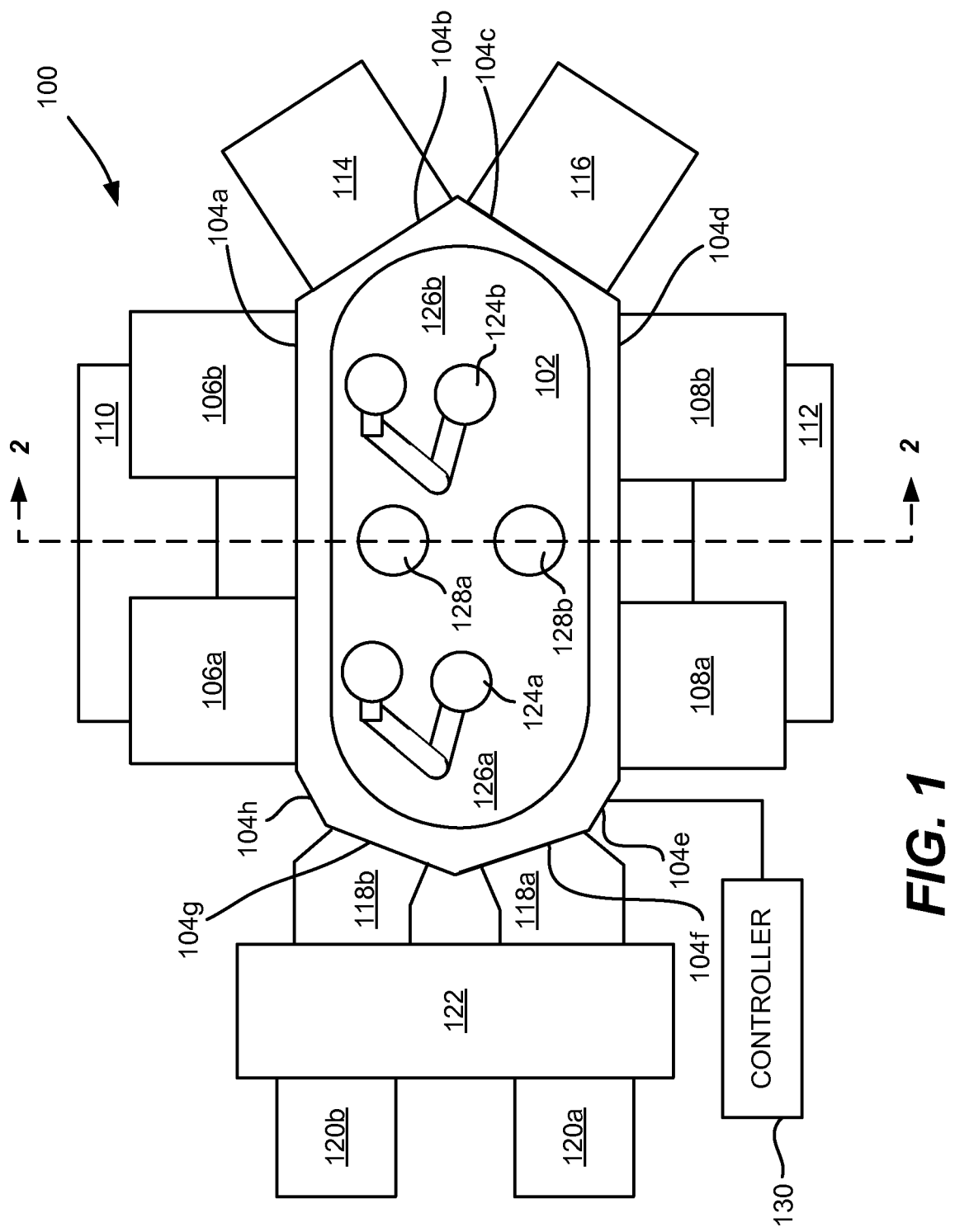
FIG. 1 illustrates a top schematic view of an example processing tool provided in accordance with embodiments of the invention.

FIG. 1 is a top schematic view of an example processing tool 100 provided in accordance with embodiments of the invention. With reference to FIG. 1, the tool 100 includes a transfer chamber 102 having a plurality of sides 104a-104h (forming an octagonal shaped transfer chamber). Other shapes and/or numbers of sides may be employed (e.g., forming a closed polygon).

In the embodiment of FIG. 1, sides 104a and 104d are elongated to allow coupling of twinned processing chambers 106a, 106b along side 104a and twinned processing chambers 108a, 108b along side 104d. Other configurations may be employed, such as coupling non-twinned or "single" processing chambers along the side 104a and/or 104d. In some embodiments, the lengths for the elongated sides 104a, 104d of transfer chamber 102 that couple to twinned processing chambers may be about 1100 mm to about 2500 mm. Other lengths may be employed for the elongated sides 104a and/or 104d.

Twinned processing chambers 106a, 106a may share resources such as chemical and/or gas delivery, process control, and the like (indicated generally by reference numeral 110). For example, such processing chambers may perform the same process recipe on two substrates simultaneously in some embodiments. Similarly, twinned processing chambers 108a, 108b may share resources such as chemical and/or gas delivery, process control, and the like (indicated generally by reference numeral 112).

Single processing chambers 114 and/or 116 may be coupled to sides 104b and/or 104c of transfer chamber 102. In some embodiments, the lengths of the sides 104b, 104c of transfer chamber 102 to which single processing chambers couple may be about 550 mm to about 2500 mm. Other lengths for the sides 104b and/or 104c may be employed. Single processing chambers typically employ their own resources such as chemical and/or gas delivery, process control, etc. (not shown). Fewer or more processing chambers may be coupled to the transfer chamber 102.

In some embodiments, load lock chambers 118a, 118b may couple to sides 104f, 104g of transfer chamber 102, respectively. Load lock chambers 118a, 118b allow substrates to be supplied to transfer chamber 102 from substrate carriers 120a, 120b via a factory interface 122. Load lock chambers 118a, 118b may be, for example, batch load locks, stacked single substrate load locks or other suitable load locks.

In the embodiment of FIG. 1, the transfer chamber 102 includes two substrate handlers 124a, 124b for transferring substrates to and from the load locks 118a, 118b, and to and from one or more of the processing chambers 106a, 106b, 108a, 108b, 114 and/or 116. For example, first substrate handler 124a may transfer substrates to and/or from one or more of the load locks 118a, 118b and processing chambers 106a, 108a (within a first portion 126a of transfer chamber 102); and second substrate handler 124b may transfer substrates to and/or from one or more of processing chambers 106b, 108b, 114 and 116 (within a second portion 126b of transfer chamber 102). Substrate handlers 124a, 124b may be single or dual blade robots, for example, that carry one or more substrates.

Substrates may be passed between first and second portions 126a, 126b of transfer chamber 102 through use of one or more hand-off locations 128a, 128b. While two hand-off locations are shown in FIG. 1, it will be understood that fewer or more hand-off locations may be employed (e.g., 1, 3, 4, 5, etc.). To transfer a substrate from the first portion 126a of transfer chamber 102 to the second portion 126b of transfer chamber 102, the first substrate handler 124a may place the substrate on hand-off location 128a or 128b and the second substrate handler 124b may retrieve the substrate from the hand-off location 128a or 128b. The reverse process may be performed to transfer substrates from the second portion 126b to the first portion 126a of the transfer chamber 102.

A controller 130 may be employed to control operation of the processing tool 100. For example, controller 130 may control substrate transfers to, from and/or within the processing tool 100, operation of one or more of the processing chambers 106a, 106b, 108a, 108b, 114, 116, operation of load locks 118a, 118b, etc. Controller 130 may be an appropriately programmed microprocessor or microcontroller, hardware circuitry, a combination thereof, etc. The controller 130 may contain computer program code for performing any of the methods described herein.

Figure 2:
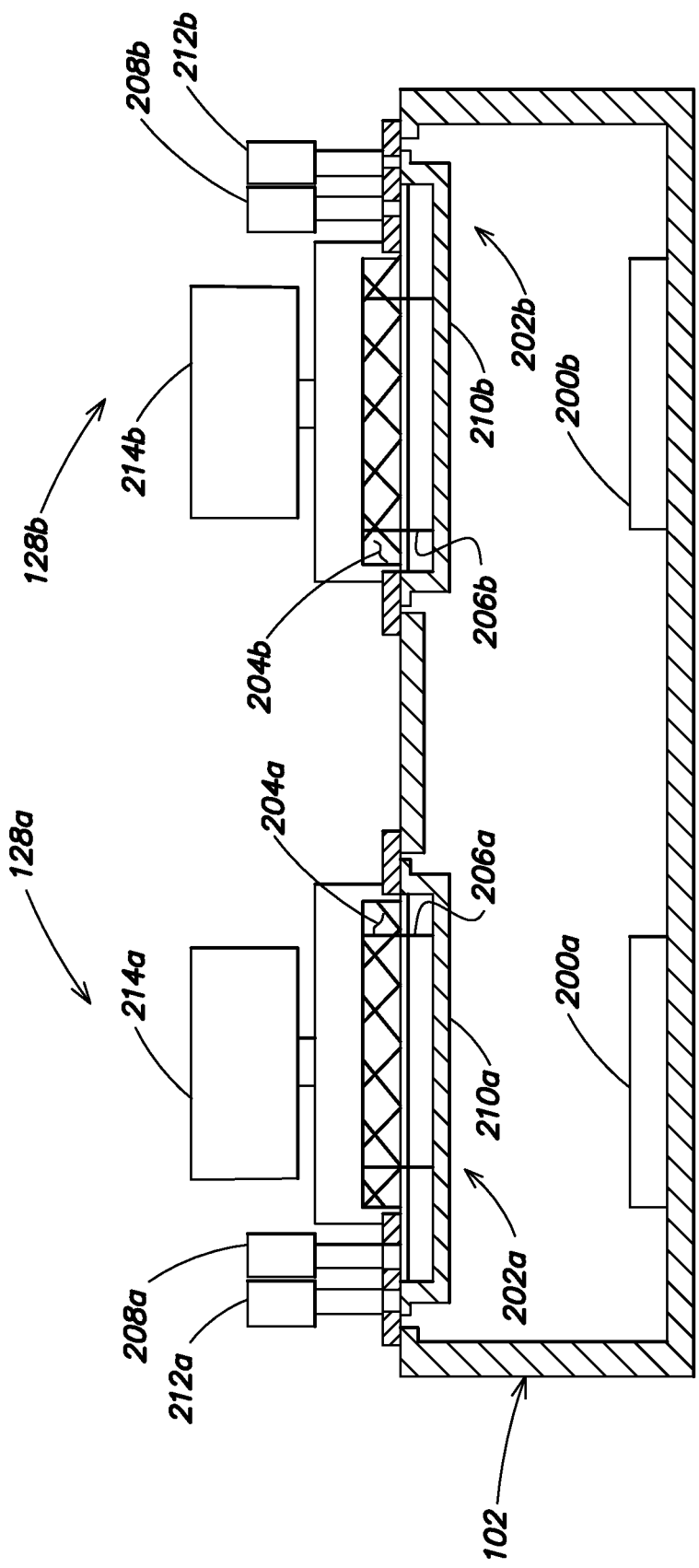
FIG. 2 illustrates a partial cross-sectional view of the hand-off locations of FIG. 1 taken along line 2-2 of FIG. 1 in accordance with embodiments of the invention.

FIG. 2 is a partial cross-sectional view of the hand-off locations 128a, 128b of FIG. 1 taken along line 2-2 of FIG. 1. Hand-off locations 128a, 128b may include pedestals or supports 200a, 200b for supporting a substrate being transferred between substrate handlers 124a and 124b. In the embodiment shown, the supports 200a, 200b are positioned near a bottom of transfer chamber 102. However, the supports 200a, 200b may be positioned at any other location such as in the middle or at the top of transfer chamber 102 and/or at different locations. Other numbers of hand-off locations and/or supports may be employed (e.g., 1, 3, 4, 5, etc.).

Supports 200a, 200b may be formed from glass, aluminum, ceramic or another suitable material. If desired, lift pins (not shown) may be employed to raise and/or lower substrates relative to the supporting surface of supports 200a, 200b.

In some embodiments, hand-off locations 128a, 128b may include processing regions 202a and 202b configured to perform one or more processes on substrates within the hand-off locations 128a, 128b. Example processes include pre- and/or post processing such as degas, annealing, cool down, plasma treatment, or the like. Other processes and/or numbers of processing regions 202a and 202b may be employed.

In the embodiment of FIG. 2, the processing regions 202a, 202b are positioned at an elevation above the supports 200a, 200b. In other embodiments, the processing regions 202a, 202b may be located below the supports 200a, 200b or at another suitable elevation relative to the supports 200a, 200b.

In some embodiments, processing regions 202a, 202b may include heaters 204a, 204b for heating substrates loaded into the processing regions 202a, 202b. Lift pins 206a, 206b may be employed to lower substrates onto and/or lifting substrates from the heaters 204a, 204b, respectively (e.g., with linear or other motors 208a, 208b).

In one or more embodiments, shields 210a, 210b may be employed to isolate the environment within the processing regions 202a, 202b from other portions of the transfer chamber 102. For example, the shields 210a, 210b may be formed from a metal such as aluminum, stainless steel or any other suitable material. If desired, the shields 210a and 210b may form a vacuum seal between the heaters 204a, 204b and the remainder of transfer chamber 102 and/or form a separately controllable environment. The shields 210a, 210b may be raised and/or lowered to allow substrates to be placed within and/or removed from processing regions 202a, 202b, such as by motors 212a, 212b, for example.

Each processing region 202a, 202b may include separate controls 214a, 214b for controlling operation of the heaters 204a, 204b, motors 208a, 208b, 212a, 212b, and/or delivery of any processing gasses or other resources/utilities to processing regions 202a, 202b. In some embodiments, all or a portion of the controls 214a, 214b may be implemented by controller 130 of processing tool 100.

In general, hand-off location 128a, 128b may be employed for substrate hand-off operations, substrate storage, chuck cover storage, cool-down, substrate heating, active pre- or post-processing, etc.

In operation, substrates may be delivered to the processing tool 100 via substrate carriers 120a and 120b at factory interface 122. A robot or other substrate handler (not shown) within the factory interface 122 may extract a substrate from one of the substrate carriers 120a, 120b and deliver the substrate to load lock 118a or 118b. Substrate handler 124a then may extract the substrate and transfer the substrate to a desired location. For example, the substrate may be transferred to a hand-off location 128a, 128b for pre-processing and/or to processing chamber 106a or 108a. If the substrate is placed in the hand-off location 128a, 128b, the substrate may be returned to the first substrate handler 124a or transferred to second substrate handler 124b for processing within one or more of the processing chambers 106b, 108b, 114 and/or 116.

Controller 130 may be programmed to control operation of and/or substrate transfers by substrate handlers 124a, 124b, as well as pre- and post-processing within hand-off locations 128a, 128b (if employed). In some embodiments, substrate transfers by substrate handlers 124a, 124b may be synchronized to simultaneously load and/or unload substrates from twinned processing chambers 106a, 106b and/or 108a, 108b.

As stated, twinned processing chambers 106a, 106b and 108a, 108b may share resources and thus are less expensive to operate. In some embodiments, these twinned processing chambers may employ lower throughput processes such as epitaxial grown, etch, chemical vapor deposition (CVD), or the like. Single processing chambers 114, 116 may employ higher throughput processes, and/or may be larger-sized processing chambers or processing chambers not well suited for twinned operation. Examples of processes that may be employed within single processing chambers 114, 116 include physical vapor deposition (PVD), rapid thermal processing (RTP), epitaxial growth, or the like.

In some embodiments, one of the load lock chambers 118a, 118b may be replaced with an additional processing chamber. Substrates may then enter and exit the processing tool 100 through a single load lock chamber.

Figure 3:
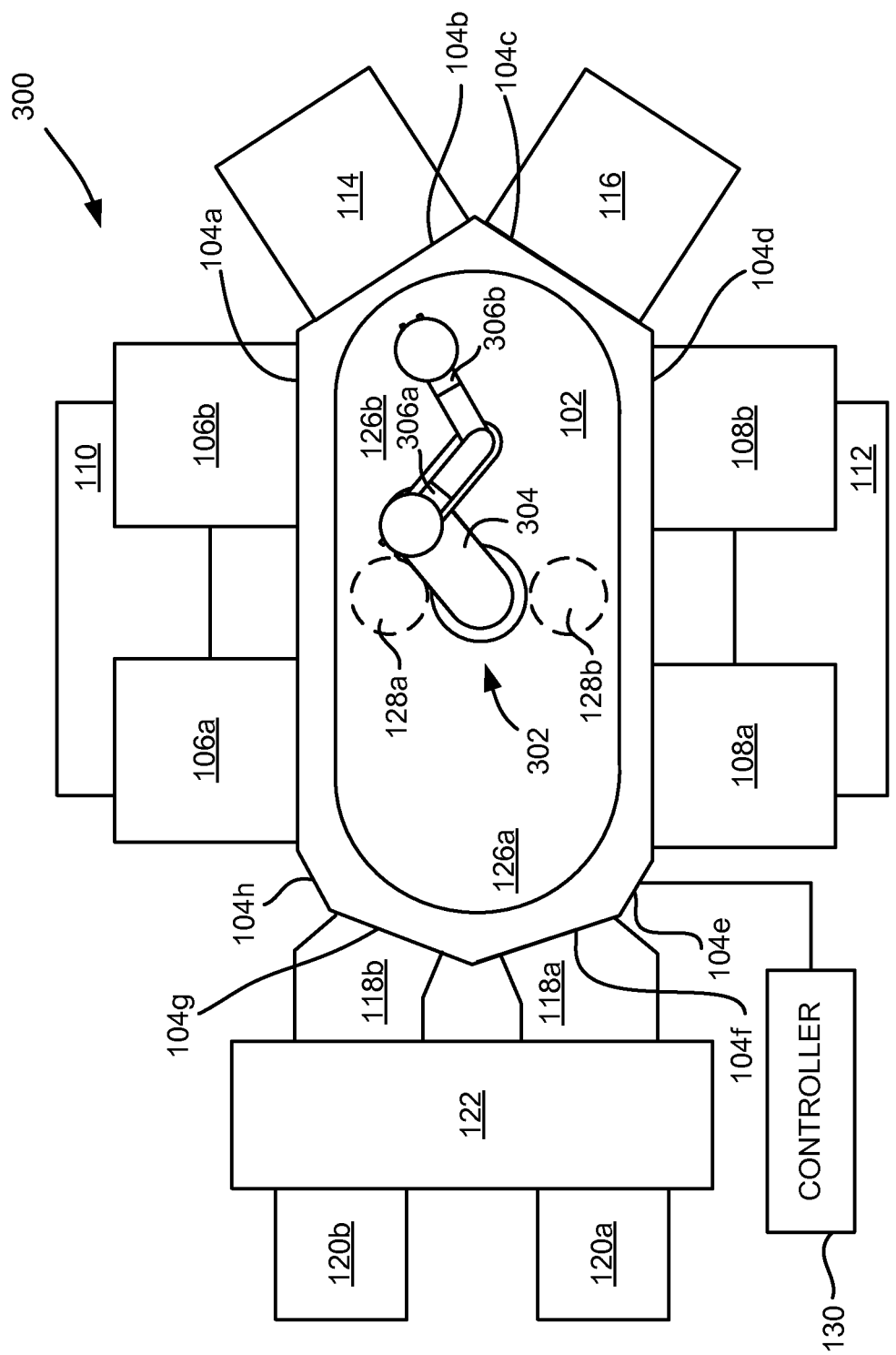
FIG. 3 illustrates a top schematic view of another example processing tool provided in accordance with embodiments of the invention.

FIG. 3 is a top schematic view of an example processing tool 300 provided in accordance with embodiments of the invention. The processing tool 300 is similar to the processing tool 100 of FIG. 1, with substrate handlers 124a, 124b of processing tool 100 replaced with a single substrate handler 302 as shown in FIG. 3. In some embodiments, the single substrate handler 302 may be an extended reach robot having a reach sufficient to transfer substrates between all of the load lock chambers 118a, 118b and processing chambers 106a, 106b, 108a, 108b, 114 and 116. For example, the substrate handler 302 may be an off-axis substrate handler, a substrate handler with an extended boom 304 (as shown in FIG. 3), or the like. In the embodiment of FIG. 3, the substrate handler 302 is a dual blade robot with blades 306a, 306b that may simultaneously transport two substrates. Fewer or more blades may be employed.

The processing tool 300 may operate similar to the processing tool 100 of FIG. 1. For example, substrates may be processed simultaneously in twinned processing chambers 106a, 106b and/or 108a, 108b and/or pre- or post-processed in hand-off locations 128a, 128b. For example, substrates may be loaded sequentially into twinned processing chambers 106a, 106b and 108a, 108b in some embodiments. As stated, hand-off locations 128a, 128b may be employed for substrate hand-off operations, substrate storage, chuck cover storage, cool-down, substrate heating, active pre- or post-processing, etc.

Figure 4:
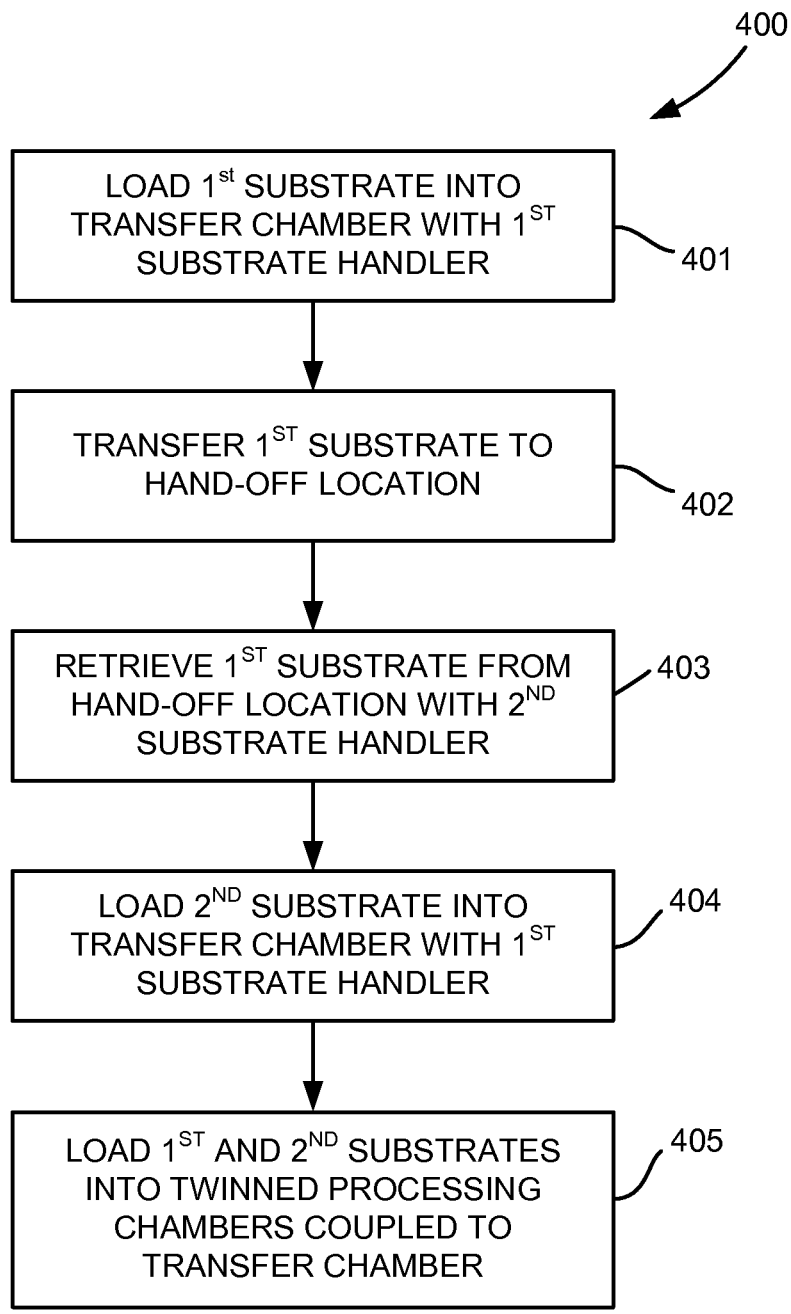
FIG. 4 illustrates a flowchart of an example method of operating the processing tool of FIG. 1 in accordance with embodiments of the invention.

FIG. 4 is a flowchart of an example method 400 of operating the processing tool 100 of FIG. 1. With reference to FIG. 4, in Block 401 a first substrate is loaded into transfer chamber 102 using first substrate handler 124a. In Block 402 the first substrate is transferred to one of the hand-off locations 128a or 128b. In some embodiments, the first substrate may be pre-processed while at the hand-off location 128a or 128b, such as by performing a degas or other process on the substrate.

In Block 403 the second substrate handler 124b may retrieve the first substrate from the hand-off location 128a or 128b. Before, during or after Block 403, the first substrate handler 124a may load a second substrate into the transfer chamber 102 (Block 404). In some embodiments, the second substrate may be pre-processed at a hand-off location 128a or 128b, such as by performing a degas or other process on the substrate.

In Block 405, the first and second substrates are loaded into the twinned processing chambers 106a, 106b by substrate handlers 124a and 124b. In some embodiments this transfer may be performed simultaneously. For example, controller 130 may direct substrate handlers 124a and 124b to simultaneously load the substrates into the twinned processing chambers 106a, 106b for (simultaneous) processing. In other embodiments the substrates may be (initially) transferred to the twinned processing chambers 108a, 108b.

Following processing within the twinned processing chambers 106a, 106b, the first and/or second substrate may stored, post-processed, or the like within one of the hand-off locations 128a or 128b and/or transferred to other processing chambers for further processing. The processing tool 300 of FIG. 3 may operate similarly with regard to use of the hand-off locations 128a and/or 128b.

The present invention has been disclosed in connection with example embodiments thereof. It should be understood that other embodiments may fall within the spirit and scope of the invention, as defined by the following claims.

What is claimed is:

1. A transfer chamber configured for use during semiconductor device manufacturing comprising:
   a plurality of sides that define a single chamber region configured to maintain a vacuum level and allow transport of substrates between a plurality of processing chambers, the single chamber region defining a first portion of the transfer chamber and a second portion of the transfer chamber, the plurality of sides including:
      a first side capable of coupling to a first set of twinned processing chambers, and
      a second side capable of coupling to a single processing chamber;
   a first substrate handler located in the first portion of the transfer chamber;
   a second substrate handler located in the second portion of the transfer chamber, wherein the second substrate handler is capable of loading a second substrate into one of the chambers of the first set of twinned processing chambers simultaneously as the first substrate handler loads a first substrate into the other of the chambers of the first set of twinned processing chambers; and a hand-off location in the single chamber region configured to allow substrates to be passed between the first portion of the transfer chamber and the second portion of the transfer chamber using the first substrate handler and the second substrate handler, wherein the hand-off location further comprises a processing region configured to perform a process on a substrate within the processing region, wherein the hand-off location is configured to allow substrates to be passed between the first and second portions of the transfer chamber at a first elevation and wherein the processing region of the hand-off location is located at a second elevation that is different than the first elevation.

2. The transfer chamber of claim 1, wherein the plurality of sides form a closed polygon shape.

3. The transfer chamber of claim 1, further comprising a third side opposite the first side that is capable of coupling to a second set of twinned processing chambers.

4. The transfer chamber of claim 1, wherein the second elevation is above the first elevation.

5. The transfer chamber of claim 1, wherein the processing region of the hand-off location is configured to perform at least one of pre-processing for one or more processing chambers coupled to the transfer chamber and post-processing for one or more processing chambers coupled to the transfer chamber.

6. The transfer chamber of claim 1, further comprising one or more additional hand-off locations configured to allow substrates to be passed between the first portion of the transfer chamber and the second portion of the transfer chamber using the first substrate handler and the second substrate handler.

7. The transfer chamber of claim 6, wherein each hand-off location includes a processing region configured to perform a process on a substrate within the processing region.

* * * * *